(12) United States Patent
Hwang et al.

(10) Patent No.: US 8,174,126 B2
(45) Date of Patent: May 8, 2012

(54) STACKED MULTI-CHIP

(75) Inventors: Ting-Ting Hwang, Hsinchu (TW); Hsien-Te Chen, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 127 days.

(21) Appl. No.: 12/882,805

(22) Filed: Sep. 15, 2010

(65) Prior Publication Data

US 2012/0007251 A1 Jan. 12, 2012

(30) Foreign Application Priority Data

Jul. 8, 2010 (TW) ................................ 99122477 A

(51) Int. Cl.
H01L 23/12 (2006.01)
H01L 23/52 (2006.01)
H01L 23/48 (2006.01)

(52) U.S. Cl. ................ 257/777; 257/E25.017; 257/686; 257/774; 438/108; 438/109; 361/760

(58) Field of Classification Search ........... 257/E23.011, 257/E25.017, 685, 686, 723, 724, 774, 777; 438/107–109, 110; 361/760
See application file for complete search history.

(56) References Cited

U.S. PATENT DOCUMENTS

| | | | | |
|---|---|---|---|---|
| 4,897,708 A * | 1/1990 | Clements | ................. | 257/690 |
| 5,530,288 A * | 6/1996 | Stone | ................. | 257/700 |
| 6,429,096 B1 * | 8/2002 | Yanagida | ................. | 438/459 |
| 6,756,681 B1 * | 6/2004 | Hanawa | ................. | 257/774 |
| 6,848,177 B2 * | 2/2005 | Swan et al. | ................. | 29/852 |
| 6,916,725 B2 * | 7/2005 | Yamaguchi | ................. | 438/459 |
| 7,091,592 B2 | 8/2006 | Chen et al. | | |
| 7,259,454 B2 * | 8/2007 | Tanida et al. | ................. | 257/698 |
| 7,355,290 B2 * | 4/2008 | Shioga et al. | ................. | 257/790 |
| 7,446,420 B1 * | 11/2008 | Kim | ................. | 257/777 |
| 7,459,777 B2 * | 12/2008 | Nakamura | ................. | 257/686 |
| 7,531,905 B2 * | 5/2009 | Ishino et al. | ................. | 257/777 |
| 7,564,118 B2 * | 7/2009 | Pogge et al. | ................. | 257/621 |
| 7,588,964 B2 * | 9/2009 | Kwon et al. | ................. | 438/109 |
| 7,598,618 B2 * | 10/2009 | Shiraishi | ................. | 257/777 |
| 7,605,458 B1 * | 10/2009 | Rahman et al. | ................. | 257/686 |
| 7,723,213 B2 * | 5/2010 | Ichikawa | ................. | 438/464 |
| 7,763,496 B2 * | 7/2010 | Ikeda et al. | ................. | 438/109 |
| 7,838,967 B2 * | 11/2010 | Chen | ................. | 257/621 |
| 7,843,052 B1 * | 11/2010 | Yoo et al. | ................. | 257/686 |
| 7,924,569 B2 * | 4/2011 | Letz | ................. | 361/717 |
| 7,977,781 B2 * | 7/2011 | Ito et al. | ................. | 257/686 |
| 2002/0003307 A1 * | 1/2002 | Suga | ................. | 257/777 |

(Continued)

*Primary Examiner* — Chris Chu
(74) *Attorney, Agent, or Firm* — Morris Manning & Martin LLP; Tim Tingkang Xia, Esq.

(57) ABSTRACT

A stacked multi-chip comprises a base layer, a first chip, a first stacked chip and at least one second stacked chip. The base layer comprises a mounting panel and a redistributed layer. The redistributed layer is mounted on the mounting panel. The first chip comprises an electrically non-conductive layer and a connective layer. The electrically non-conductive layer comprises a TSV channel. The connective layer abuts the redistributed layer. The first stacked chip is mounted on the first chip and comprises an electrically non-conductive layer and a connective layer. The electrically non-conductive layer comprises a TSV channel that is connected to the TSV channel of the first chip. The second stacked chip is mounted on the first stacked chip and comprises an electrically non-conductive layer and a connective layer. The electrically non-conductive layer comprises a TSV channel. The connective layer is connected to the connective layer of the first stacked chip.

11 Claims, 3 Drawing Sheets

U.S. PATENT DOCUMENTS

| | | | |
|---|---|---|---|
| 2005/0051883 A1* | 3/2005 | Fukazawa | 257/686 |
| 2006/0267206 A1* | 11/2006 | Tanida et al. | 257/773 |
| 2006/0278979 A1* | 12/2006 | Rangel | 257/734 |
| 2008/0203554 A1* | 8/2008 | Nishio et al. | 257/686 |
| 2008/0224322 A1* | 9/2008 | Shinogi | 257/777 |
| 2009/0021974 A1* | 1/2009 | Nonomura et al. | 365/63 |

* cited by examiner

STACKED MULTI-CHIP

FIELD OF THE INVENTION

The present invention is a stacked multi-chip.

BACKGROUND OF THE INVENTION

In high-density electrical interconnections, a conventional stacked multi-chip achieves better performance in speed and power by using Through Silicon Via (TSV) technology to stack several chips and give the stacked multi-chip high performance, high density and smaller dimensions. For example, U.S. Pat. No. 7,091,592 B2 discloses a semiconductor chip that uses TSV in a stacked multi-chip.

However, the conventional stacked multi-chip that uses TSV technology has three problems: inadequate thermal dissipation, difficulty to constructing fully-stacked TSV for all chips and difficulty of placing voltage level shifters.

Accordingly, what is needed in the art is a new design of the stacked multi-chip that uses TSV technology to have good thermal dissipation, be easy to construct fully-stacked TSV for all chips and be easy to position voltage level shifters.

SUMMARY OF THE INVENTION

The objective of the present invention is to provide a stacked multi-level chip that has good thermal dissipation, is easy to construct fully-stacked TSV for all chips and is easy to position voltage level shifters.

The stacked multi-chip in accordance with the present invention comprises a base layer, a first chip, a first stacked chip and at least one second stacked chip. The base layer comprises a mounting panel and a redistributed layer. The redistributed layer is mounted on the mounting panel.

The first chip comprises an electrically non-conductive layer and a connective layer. The electrically non-conductive layer comprises a TSV channel. The connective layer abuts the redistributed layer.

The first stacked chip is mounted on the first chip and comprises an electrically non-conductive layer and a connective layer. The electrically non-conductive layer comprises a TSV channel that is connected to the TSV channel of the first chip.

The second stacked chip is mounted on the first stacked chip and comprises an electrically non-conductive layer and a connective layer. The electrically non-conductive layer comprises a TSV channel. The connective layer is connected to the connective layer of the first stacked chip.

DETAILED DESCRIPTION OF THE PRESENT INVENTION

Figure 1:
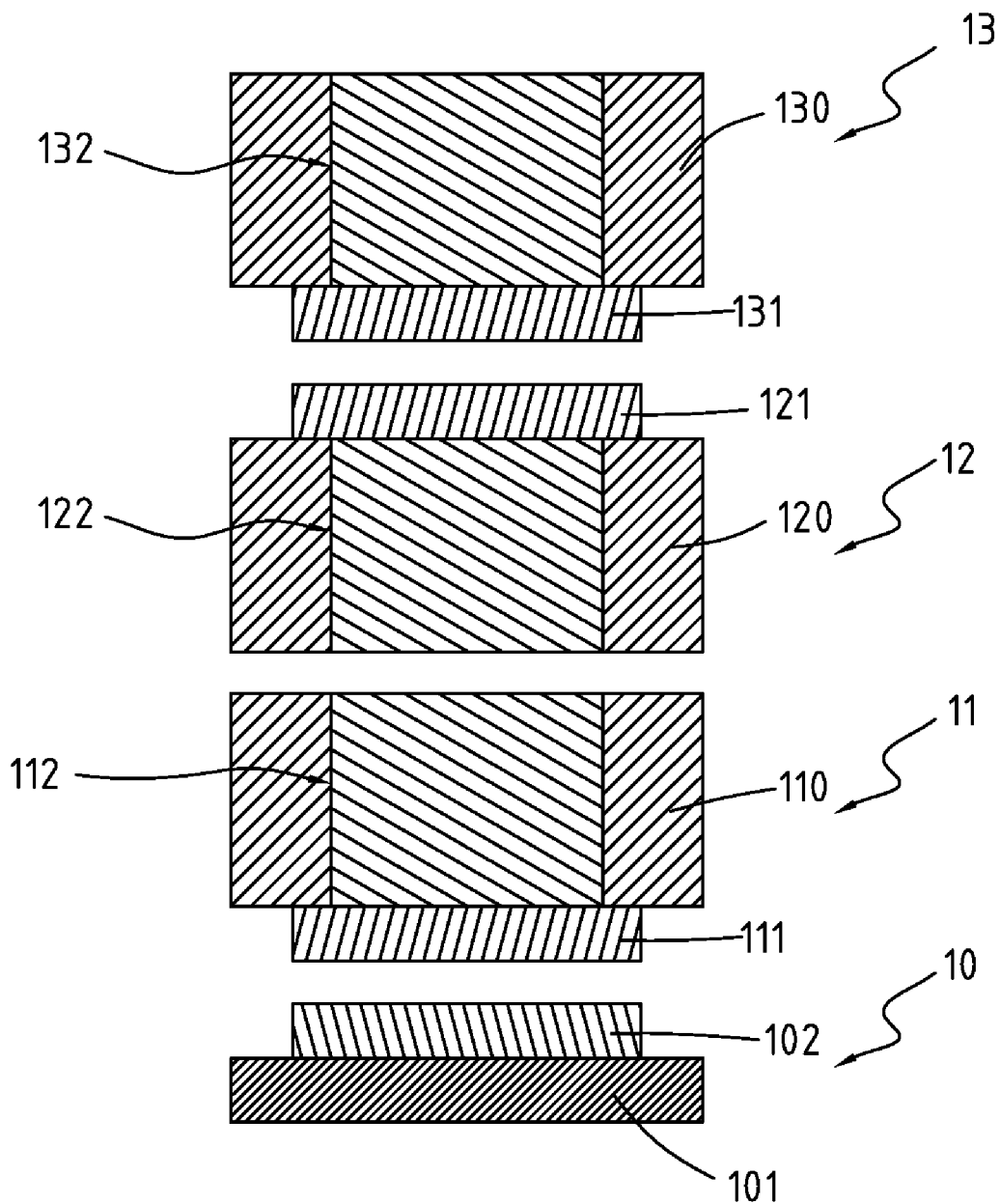
FIG. 1 is a front cross sectional view of a stacked multi-chip in accordance with the present invention.

With reference to FIG. 1, a stacked multi-chip in accordance with the present invention has good thermal dissipation, is easy to construct fully-stacked TSV for all chips, allows voltage level shifters to be easily positioned and comprises a base layer (10), a first chip (11), a first stacked chip (12) and at least one second stacked chip (13).

The base layer (10) comprises a mounting panel (101) and a redistributed layer (102). The mounting panel (101) is non-conductive and has an outer surface and an inner surface. The outer surface is mounted in an electrical device. The redistributed layer (102) is mounted on the inner surface of the mounting panel (101), has a top surface and may use metal wire mounted on the top surface.

Figure 2:
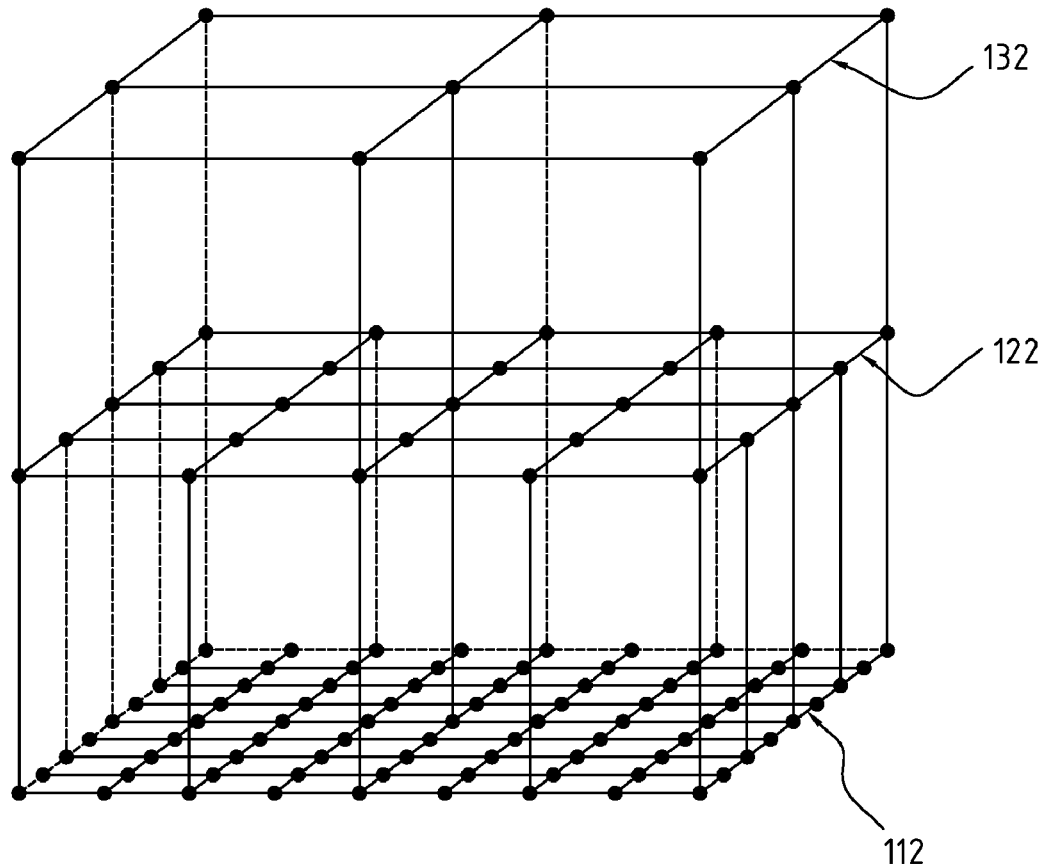
FIG. 2 is a perspective view of electrical-connections in the stacked multi-chip in FIG. 1.
Figure 3:
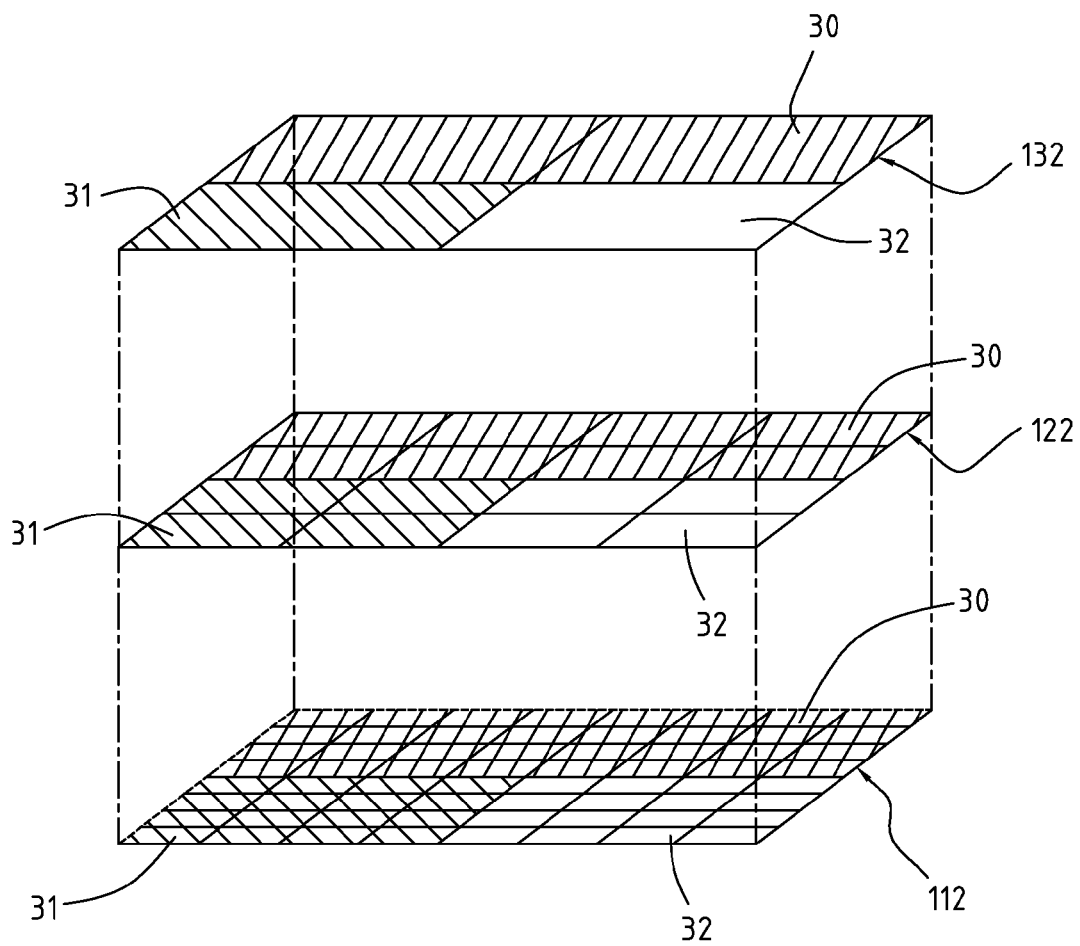
FIG. 3 is a perspective view of voltage zones of the stacked multi-chip in FIG. 1.

With further reference to FIGS. 2 and 3, the first chip (11) comprises an electrically non-conductive layer (110) and a connective layer (111). The electrically non-conductive layer (110) has a top surface and a bottom surface, may be silicon and comprises a Through Silicon Via (TSV) channel (112). The TSV channel (112) is a good thermal conductor, may have multiple voltage zones and electrical-connections, may be a hole in the electrically non-conductive layer (110) formed by TSV technology and has multiple vias formed through the channel with metal as conductors to form a decoupling capacitor that filters harmonic waves and reduces noise. The connective layer (111) is mounted against the bottom surface of the electrically non-conductive layer (110) and the TSV channel (112), abuts the redistributed layer (102) and may comprise multiple electrically and thermally conductive sections. The electrically and thermally conductive sections may be isolated from each other and may correspond respectively to the voltage zones of the TSV channel (112).

The first stacked chip (12) is mounted on the first chip (11) and comprises an electrically non-conductive layer (120) and a connective layer (121). The electrically non-conductive layer (120) has a top surface and a bottom surface, may be silicon and comprises a TSV channel (122). The TSV channel (122) corresponds and connects to the TSV channel (112) of the first chip (11), may be a hole in the electrically non-conductive layer (120) formed by TSV technology, has multiple vias and metal in the vias as conductors to form a decoupling capacitor that filters harmonic waves and reduces noise, is a good thermal conductor and may have multiple voltage zones and electrical-connections. The voltage zones of the TSV channel (122) may correspond respectively to the voltage zones of the TSV channel (112) of the first chip (11), which would make implementing voltage level shifters easy. For example, each voltage zone on the TSV channel (122) of the first stacked chip (12) may correspond to three voltage zones (30, 31, 32) on the TSV channel (112) of the first chip (11). The electrical connections of the TSV channel (122) may be proportional to the electrical connections of the TSV channel (112) of the first chip (11). The connective layer (121) is mounted against the top surface of the electrically non-conductive layer (120) and the TSV channel (122) and may comprise multiple electrically and thermally conductive sections. The electrically and thermally conductive sections may be isolated from each other and may correspond to the voltage zones of the TSV channel (122) in the first stacked chip (12).

The at least one second stacked chip (13) is mounted on the first stacked chip (12) and comprises an electrically non-conductive layer (130) and a connective layer (131). The electrically non-conductive layer (130) has a top surface and a bottom surface, may be silicon and comprises a TSV channel (132). The TSV channel (132) may be a hole in the electrically non-conductive layer (130), is formed by TSV technology with multiple vias and metal in the vias as conductors to form a decoupling capacitor that filters harmonic waves and reduces noise, is a good thermal conductor and may have multiple voltage zones and electrical-connections. The voltage zones of the TSV channel (132) may correspond to the voltage zones of the TSV channel (122) of the first stacked chip (12), which would make implementing voltage level shifters easy. For example, each voltage zone on the TSV channel (132) of the second stacked chip (13) may correspond to three voltage zones (30, 31, 32) on the TSV channel (122) of the first stacked chip (12). The electrical-connections of the TSV channel (132) may be proportional to the electrical-connections of the TSV channel (122) of the first stacked chip (12). The electrical connections may have a proportional relationship of 4:2:1. The connective layer (131) is mounted against the bottom surface of the electrically non-conductive layer (130) and the TSV channel (132), is connected to the connective layer (121) and may comprise multiple electrically and thermally conductive sections. The electrically and thermally conductive sections may be isolated from each other and may correspond respectively to the voltage zones of the TSV channel (132).

Various changes can be made without departing from the broad spirit and scope of the invention.

What is claimed is:

1. A stacked multi-chip comprising
a base layer comprising
a mounting panel being non-conductive and having
an outer surface being mounted in an electrical device; and
an inner surface; and
a redistributed layer being mounted on the inner surface of the mounting panel and having a top surface;
a first chip comprising
an electrically non-conductive layer having a top surface and a bottom surface and comprising a Through Silicon Via (TSV) channel being a good thermal conductor and having multiple vias formed through the channel with metal as conductors to form a decoupling capacitor that filters harmonic waves and reduces noise; and
a connective layer being mounted against the bottom surface of the electrically non-conductive layer and the TSV channel and abutting the redistributed layer; and
a first stacked chip being mounted on the first chip and comprising
an electrically non-conductive layer having a top surface and a bottom surface and comprising a TSV channel being a good thermal conductor, corresponding and being connected to the TSV channel of the first chip and having multiple vias and metal in the vias as conductors to form a decoupling capacitor that filters harmonic waves and reduces noise; and
a connective layer being mounted against the top surface of the electrically non-conductive layer and the TSV channel of the first stacked chip; and
at least one second stacked chip being mounted on the first stacked chip and comprising
an electrically non-conductive layer having a top surface and a bottom surface and comprising a TSV channel being formed by TSV technology with multiple vias and metal in the vias as conductors to form a decoupling capacitor and being a good thermal conductor; and
a connective layer being mounted against the bottom surface of the electrically non-conductive layer and the TSV channel of the second stacked chip and being connected to the connective layer of the first stacked chip.

2. The stacked multi-chip as claimed in claim 1, wherein the redistributed layer uses metal wire mounted on the top surface.

3. The stacked multi-chip as claimed in claim 1, wherein the electrically non-conductive layer of the first chip is silicon;

the electrically non-conductive layer of the first stacked chip is silicon; and
the electrically non-conductive layer of the second stacked chip is silicon.

4. The stacked multi-chip as claimed in claim 1, wherein the TSV channel of the first stacked chip corresponds and connects to the TSV channel of the first chip; and
the TSV channel of the second stacked chip corresponds and connects to the TSV channel of the first stacked chip.

5. The stacked multi-chip as claimed in claim 1, wherein the TSV channel of the first chip is a hole formed in the electrically non-conductive layer formed by TSV technology and has multiple vias formed through the channel with metal as conductors to form a decoupling capacitor;
the TSV channel of the first stacked chip is a hole formed in the electrically non-conductive layer formed by TSV technology and has multiple vias formed through the channel with metal as conductors to form a decoupling capacitor; and
the TSV channel of the second stacked chip is a hole formed in the electrically non-conductive layer by TSV technology and has multiple vias formed through the channel with metal in the vias as conductors to form a decoupling capacitor.

6. The stacked multi-chip as claimed in claim 1, wherein the TSV channel of the first chip has multiple voltage zones;
the TSV channel of the first stacked chip has multiple voltage zones that correspond respectively to the voltage zones of the first chip; and
the TSV channel of the second stacked chip has multiple voltage zones that correspond respectively to the voltage zones of the first stacked chip.

7. The stacked multi-chip as claimed in claim 6, wherein the connective layer of the first chip comprises
multiple electrically and thermally conductive sections being isolated from each other and corresponding respectively to the voltage zones of the TSV channel of the first chip.

8. The stacked multi-chip as claimed in claim 6, wherein the connective layer of the first stacked chip comprises
multiple electrically and thermally conductive sections being isolated from each other and corresponding respectively to the voltage zones of the TSV channel of the first stacked chip.

9. The stacked multi-chip as claimed in claim 6, wherein the connective layer of the second stacked chip comprises
multiple electrically and thermally conductive sections being isolated from each other and corresponding respectively to the voltage zones of the TSV channel of the second stacked chip.

10. The stacked multi-chip as claimed in claim 1, wherein the TSV channel of the first chip has multiple electrical-connections;
the TSV channel of the first stacked chip has multiple electrical-connections proportional to the multiple electrical-connections in the TSV channel of first chip; and
the TSV channel of the second stacked chip has multiple electrical connections proportional to the multiple electrical-connections in the TSV channel of first stacked chip.

11. The stacked multi-chip as claimed in claim 10, wherein the electrical connections are in a proportional relationship of 4:2:1.

* * * * *